United States Patent
Holcomb

(10) Patent No.: US 6,391,829 B1
(45) Date of Patent: May 21, 2002

(54) METHOD OF COATING SUPERCONDUCTOR PARTICLES BY PLATING OF SILVER METAL OUT OF MOLTEN SALT

(75) Inventor: Matthew J. Holcomb, Manhattan Beach, CA (US)

(73) Assignee: Nove Technologies, Inc., El Segundo, CA (US)

( * ) Notice: Subject to any disclaimer, the term of this patent is extended or adjusted under 35 U.S.C. 154(b) by 0 days.

(21) Appl. No.: 09/656,527

(22) Filed: Sep. 7, 2000

(51) Int. Cl.$^7$ .................. H01L 39/00; B05D 7/00; B05D 1/18

(52) U.S. Cl. ............ 505/470; 505/818; 427/215; 427/229; 427/431; 427/443.2

(58) Field of Search ................ 427/215, 229, 427/431, 443.02; 505/470, 818

(56) References Cited

U.S. PATENT DOCUMENTS

| | | | | |
|---|---|---|---|---|
| 4,971,944 A | * | 11/1990 | Charles et al. | 505/1 |
| 5,091,362 A | * | 2/1992 | Ferrando | 505/1 |
| 5,482,918 A | * | 1/1996 | Maginnis et al. | 505/440 |
| 5,696,057 A | * | 12/1997 | McArdle | 505/1 |

* cited by examiner

Primary Examiner—Michael Barr
(74) Attorney, Agent, or Firm—Blakely, Sokoloff, Taylor & Zafman

(57) ABSTRACT

According to one aspect of the invention a method is provided for forming a superconductor composite. A salt is heated to a melting temperature of the salt. Superconductor particles are added to the salt. A metal composition is added to the salt. The metal composition is decomposed into a metal substance and another substance. The metal substance plates out onto surfaces of the superconductor particles to form metal plated particles. The metal plated superconductor particles are removed from the salt.

20 Claims, 5 Drawing Sheets

METHOD OF COATING SUPERCONDUCTOR PARTICLES BY PLATING OF SILVER METAL OUT OF MOLTEN SALT

BACKGROUND OF THE INVENTION

1. Field of the Invention

This invention relates to a method and apparatus for producing a superconductor property composite.

2. Discussion of Related Art

U.S. Pat. No. 5,998,336, incorporated by reference herein, describes principles relating to the manufacture of a superconductor property composite utilizing the proximity effect. A plurality of superconductor particles are formed being of a first material which is relatively brittle and is selected to be in a superconductive state at a relatively high temperature, typically above 77 K which is the temperature of liquid nitrogen. A coating layer is formed on each superconductor particle, the coating layer being of a second material selected to be substantially non-reactive with the first material. The coated particles are then mixed with a third, matrix material to form a composite wherein the third material is in proximity to the first material but separated by the second material. The third material is selected to be relatively ductile when compared to the first material and to be driven to a superconductive state by the first material when the first material is in a superconductive state and the third material is in proximity to the first material. The second material protects the third material from oxidation by the first material. The second material is selected and is sufficiently thin to allow for the third material to be driven to the superconductive state by the first material through the second material.

The need has arisen to develop a method for forming coating layers on the superconductor particles.

SUMMARY OF THE INVENTION

According to one aspect of the invention a method is provided for forming a superconductor composite. A salt is heated to a melting temperature of the salt. Superconductor particles are added to the salt. A metal composition is added to the salt. The metal composition is decomposed into a metal substance and another substance. The metal substance plates out onto surfaces of the superconductor particles to form metal plated particles. The metal plated superconductor particles are removed from the salt.

BRIEF DESCRIPTION OF THE DRAWINGS

The invention is further described by way of examples with reference to the accompanying drawings wherein.

DETAILED DESCRIPTION OF THE INVENTION

Figure 1:
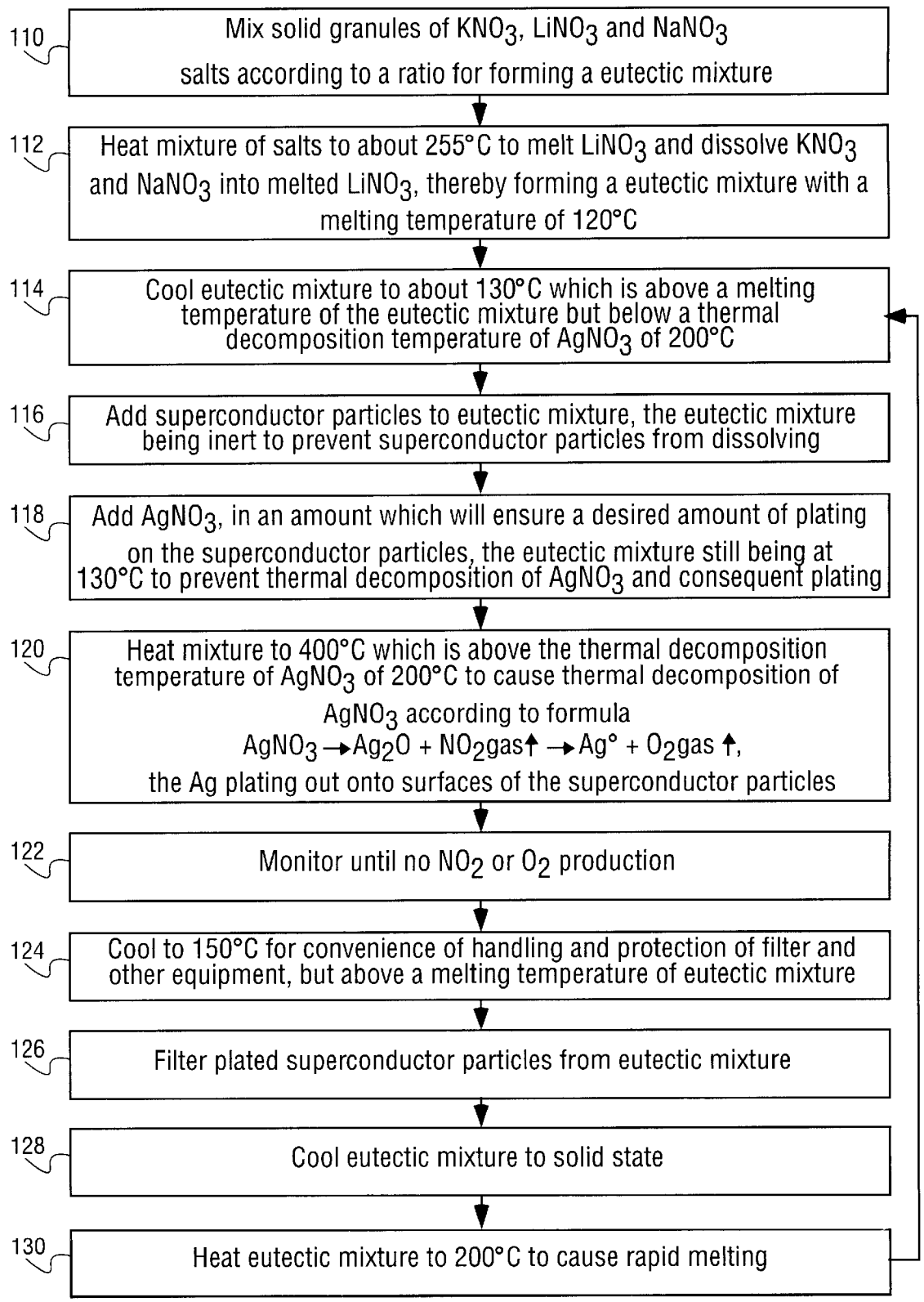
FIG. 1 is a flow chart illustrating a method of plating onto superconductor particles utilizing a eutectic mixture of salts into which $AgNO_3$ is dissolved and subsequently thermally decomposed.

FIG. 1 of the accompanying drawings illustrates a method for forming a superconductor composite according to an embodiment of the invention. A molten salt mixture, in this case a eutectic, is used having a relatively low melting temperature. The low melting temperature allows for a silver composition to be in, in this case is dissolved, in the molten salt without causing thermal decomposition of the silver composition, and thus without any silver plating. The molten salt is also substantially inert in that the superconductor particles do not dissolve in the molten salt and because the molten salt contains no water and no carbon. Plating on the superconductor particles can be achieved by mixing the superconductor particles with the molten salt eutectic and the silver composition, and then heating the mixture to a temperature which is above the thermal decomposition temperature of the silver composition, causing thermal decomposition of the silver composition, and plating of silver on the superconductor particles.

In step 110 solid granules of potassium nitrate ($KNO_3$), lithium nitrate ($LiNO_3$), and sodium nitrate ($NaNO_3$) are mixed according to a ratio for forming a eutectic mixture when heated. The ratio of the salts is typically about 17 molar percentage $NaNO_3$, 30 molar percentage $LiNO_3$, and 53 molar percentage $KNO_3$. The mixture of salts is located within a container which is surrounded by an inert argon atmosphere. Such containers are known in the art.

In step 112 the mixture of salts is heated to about 255° C. $LiNO_3$ melts at about 255° C. to form a liquid. The $KNO_3$ and the $NaNO_3$ dissolve into the melted liquid $LiNO_3$. A eutectic mixture of $LiNO_3$ $KNO_3$ and $NaNO_3$ is thereby formed. The eutectic mixture has a relatively low melting temperature of about 120° C., much lower than the melting temperature of 255° C. of the $LiNO_3$ and melting temperatures of 333° C. of $KNO_3$ and the 308° C. of $NaNO_3$.

In step 114 the eutectic mixture is cooled to about 130° C. which is above the melting temperature of the eutectic mixture of 120° C. but below a thermal decomposition temperature of silver nitrate ($AgNO_3$) of 200° C.

In step 116 superconductor particles are added to the eutectic mixture. The superconductor particles are mixed substantially uniformly through the eutectic mixture. The eutectic mixture is substantially inert in the sense that the superconductor particles do not dissolve into the eutectic mixture. The eutectic mixture does not contain any carbon or water which could attack the superconductor particles. The superconductor particles can remain substantially intact within the eutectic mixture up to a temperature of about 500° C. The temperature of the eutectic mixture is maintained at about 130° C. throughout. The superconductor particles are generally of the kind that are superconductive at 77 K, the temperature of liquid nitrogen. Examples of materials of the superconductor particles are described in the specification of U.S. Pat. No. 5,998,336.

In step 118 $AgNO_3$ is added to the eutectic mixture in an amount which will ensure a desired amount of plating on the superconductor particles. The $AgNO_3$ dissolves into the eutectic mixture. The eutectic mixture is maintained at 130° C. throughout, thereby preventing thermal decomposition of the $AgNO_3$ and consequent plating of silver.

In step 120 the eutectic mixture and its ingredients are heated to about 400° C. The temperature of 400° C. is above the thermal decomposition temperature of $AgNO_3$ of 200° C. in the eutectic mixture. The $AgNO_3$ thermally decomposes according to the unbalanced equation.

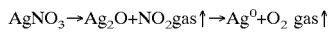

$$AgNO_3 \rightarrow Ag_2O + NO_2 gas\uparrow \rightarrow Ag^o + O_2 \text{ gas}\uparrow$$

The silver resulting from the thermal decomposition plates out onto all surfaces. The superconductor particles are relatively small in size so that they, in combination, have a relatively large surface area when compared to a container of the mixture. The majority of the silver therefore deposits or plates out on surfaces of the superconductor particles.

It can thus be seen that silver is plated onto the superconductor particles utilizing a eutectic mixture which is inert in the sense that superconductor particles do not dissolve in the eutectic mixture and also in the sense that it does not contain any carbon or water which could attack the superconductor particles. The eutectic mixture also has a melting temperature which is low enough to prevent thermal decomposition of $AgNO_3$ when in solution in the eutectic.

In step 122 the reaction is monitored. The $NO_2$ and $O_2$ gases that evolve from the reaction are monitored by an apparatus that measures partial pressure of these gases. Such an apparatus is known in the art. An operator can determine that substantially all the $AgNO_3$ is thermally decomposed when no more $NO_2$ or $O_2$ gases are produced. A desired thickness of silver plated on a superconductor particle can be controlled by controlling the amount of $AgNO_3$ added to the eutectic mixture in step 118. Relatively thick layers can be plated because $AgNO_3$ dissolves in the eutectic mixture. More $AgNO_3$ can thus be used because it is easier to control than a substance that does not dissolve.

In step 124 the eutectic mixture and its ingredients are cooled from 400° C. to 150° C. The temperature of 150° C. is sufficiently low for purposes of convenience of handling and for purposes of protection of a filter and other equipment subsequently used. The temperature of 150° C. is still above a melting temperature of the eutectic mixture, thus allowing for filtering of the superconductor particles from the eutectic mixture.

In step 126 the superconductor particles are filtered from the eutectic mixture utilizing a filter which allows the liquid eutectic mixture to pass through but captures the plated superconductor particles. The plated superconductor particles are thereby separated from the eutectic mixture.

In step 128 the eutectic mixture may be cooled to a solid state for purposes of later use.

In step 130 the eutectic mixture can again be heated to about 200° C. The temperature of 200° C. is above the melting temperature of 120° C. of the eutectic mixture, which causes the eutectic mixture to melt. The temperature of 200° C. is also chosen to ensure rapid melting of the eutectic mixture. The eutectic mixture can then again be cooled to 130° C. according to step 114, whereafter step 116 and the following steps can again be carried out, and the process be repeated. The process is repeated until a desired amount of superconductor particles are produced. The plated superconductor particles are then mixed with a matrix material to form a superconductor composition. Details of the superconductor composition are described in the specification of U.S. Pat. No. 5,998,336. Suffice to say that the matrix material is selected to be driven to a superconductor state by the superconductor particles. The silver that is plated on the superconductor particles is selected and is of a suitable thickness which allows the matrix material to be driven to a superconductive state by the superconductor particles through the silver. At the same time, the silver prevents oxidation of the matrix material by the superconductor particles.

An advantage of using $AgNO_3$ is that it dissolves into a eutectic mixture of $KNO_3$, $LiNO_3$, and $NaNO_3$. An analogous composition to $AgNO_3$ is $AgNO_2$ which probably thermally decomposes at about the same temperature and the same eutectic mixture thus allowing for thick silver layers to be plated. $AgNO_2$ also dissolves in the eutectic mixture. $AgNO_3$ and $AgNO_2$ however both have the disadvantage that they decompose at relatively low temperatures in the eutectic mixture. For that reason the eutectic mixture has to be cooled to 130° C. in step 114 in FIG. 1 in order to prevent thermal decomposition of $AgNO_3$ or $AgNO_2$.

Figure 2:
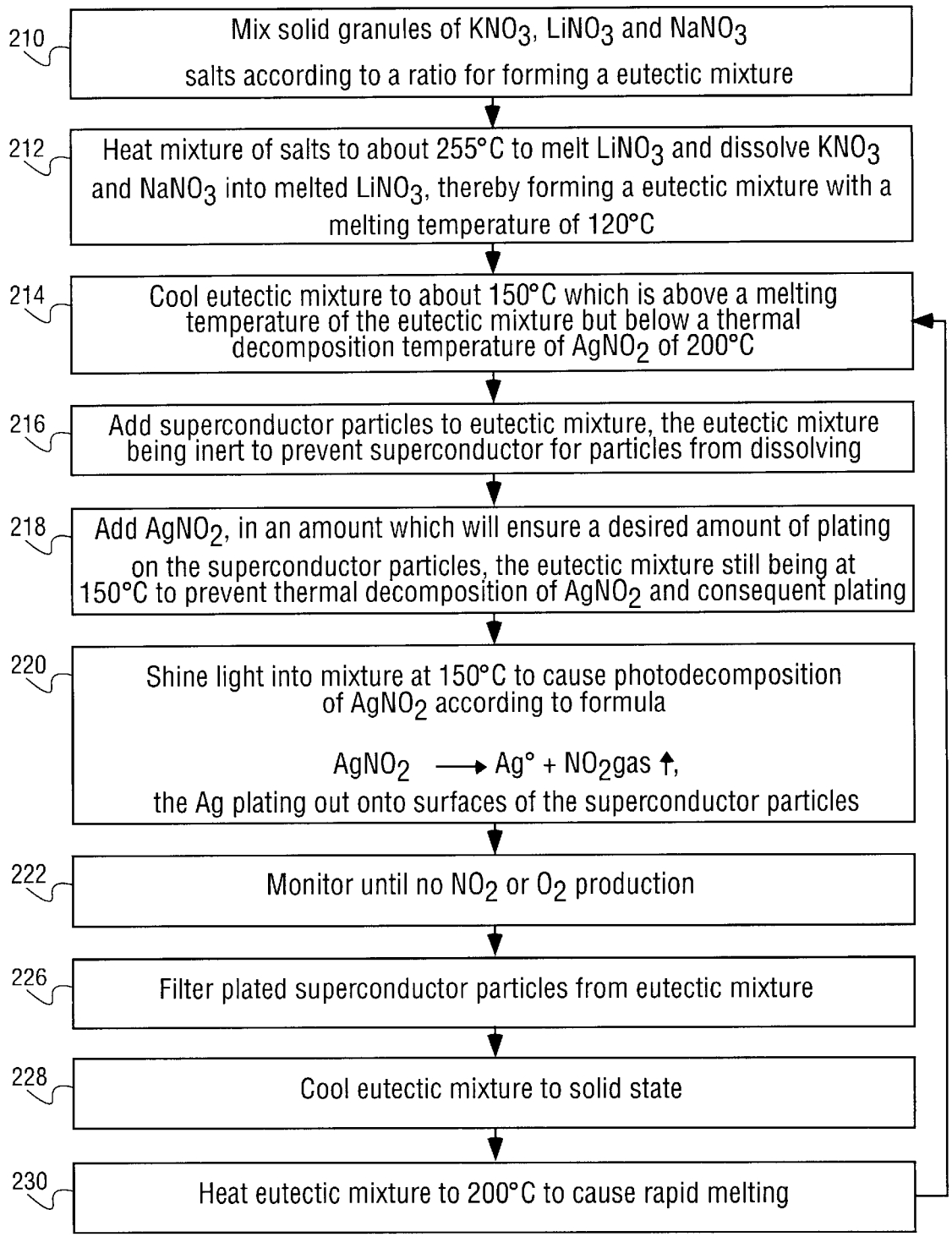
FIG. 2 is a flow chart illustrating another method of plating onto superconductor particles utilizing a eutectic mixture of salts into which $AgNO_2$ is dissolved and subsequently photodecomposed.

FIG. 2 illustrates another method that may be employed for purposes of plating utilizing $AgNO_2$. According to the method in FIG. 2, photodecomposition is utilized instead of thermal decomposition.

Steps 210 and 212 are the same as steps 110 and 112 in FIG. 1, respectively.

In step 214 the eutectic mixture is cooled to about 150° C. Steps 216 and 218 are the same as steps 116 and 118 in FIG. 1, respectively except that $AgNO_2$ is added in step 218.

In step 220 an operator shines light of a desired frequency and intensity into the mixture which is still at about 150° C. The light causes photodecomposition of the $AgNO_2$ to form silver metal and $NO_2$ gas. Silver resulting from photodecomposition plates out onto surfaces of the superconductor particles.

In step 222 the reaction is also monitored as in step 122 in FIG. 1.

In step 226 the plated superconductor particles are filtered from the eutectic mixture. It should be noted that the eutectic mixture is and remains at about 150° C. during and following step 220. There is thus no need to cool the eutectic mixture as in step 124 in FIG. 1. Following step 226, steps 228 and 230 are carried out which are the same as steps 128 and 130 in FIG. 1, respectively. Step 214 can then be carried out and the process be repeated.

Thus, thermal decomposition of $AgNO_3$ is described in FIG. 1 and photodecomposition of $AgNO_2$ is described in FIG. 2. Another process that may be used for decomposition of $AgNO_3$ is sonification. Sonification can be carried out according to the process described in FIG. 1 except for step 120 where the mixture is heated to 400° C. Instead, in step 120 the mixture can be vibrated, typically at an ultrasonic frequency which is selected to cause decomposition of $AgNO_3$ according to the same chemical reaction.

Figure 3:
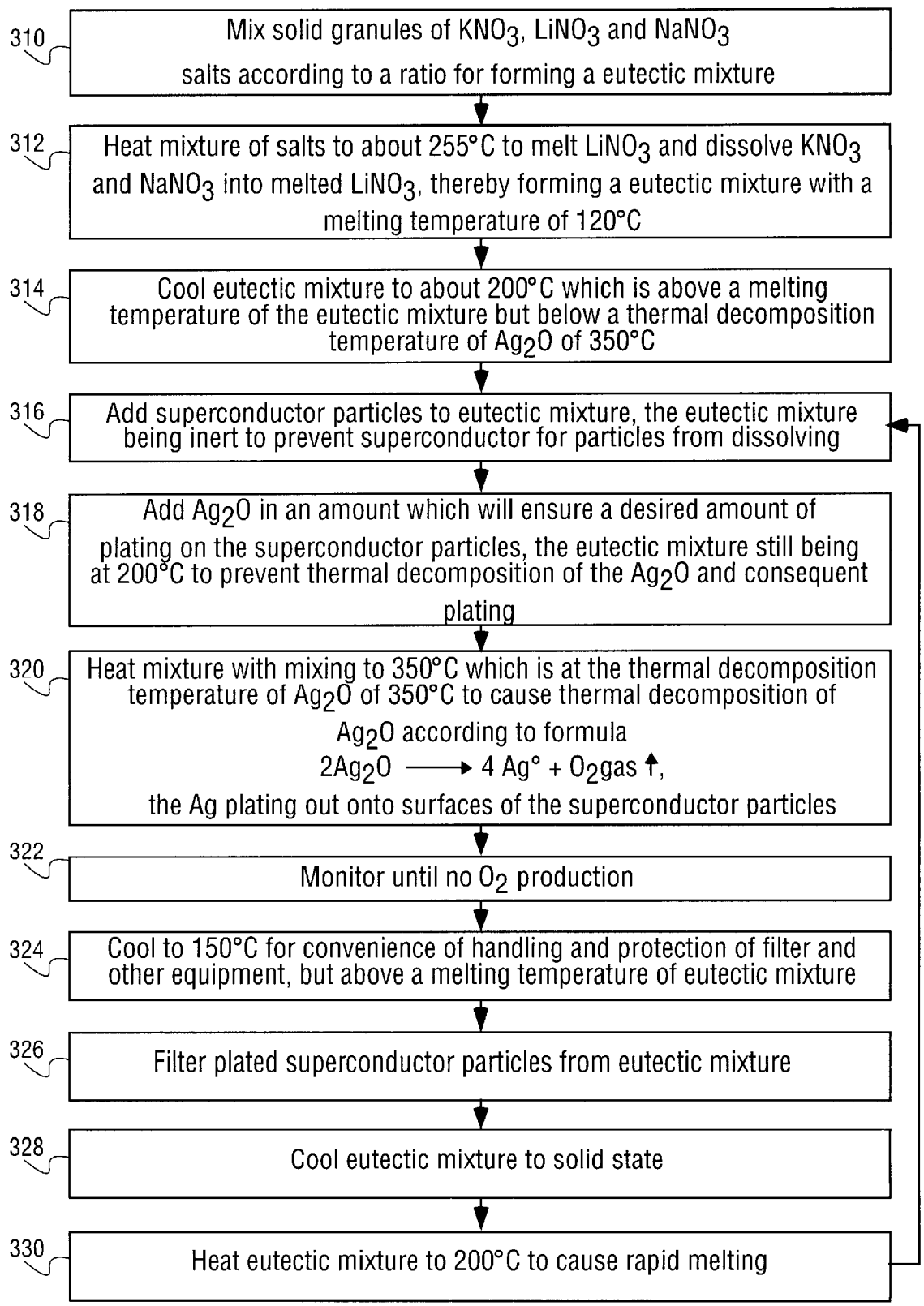
FIG. 3 is a flow chart of a further method of plating onto superconductor particles utilizing $Ag_2O$ in suspension in a eutectic mixture and subsequent thermal decomposition of the $Ag_2O$.

FIG. 3 illustrates a thermal decomposition method wherein a silver oxide, $Ag_2O$ is used as a composition for providing silver. $Ag_2O$ has the disadvantage that it does not go into solution in the eutectic mixture, although it has the advantage that it has a relatively high thermal decomposition temperature, thus negating the need for cooling the eutectic mixture to prevent thermal decomposition of the $Ag_2O$.

Steps 310 and 312 are the same as steps 110 and 112 in FIG. 1, respectively. In step 314 the eutectic mixture is cooled to about 200° C. There is no need to cool the eutectic mixture any further because $Ag_2O$ has a thermal decomposition temperature of 350° C.

Next, step 316 is carried out which is the same as step 116 in FIG. 1. In step 318 $Ag_2O$ is added to the eutectic mixture in an amount which will ensure a desired amount of plating on the superconductor particles. The eutectic mixture is still at 200° C. which is sufficiently low to prevent thermal decomposition of the Ag$_2$O and consequent plating of silver.

In step 320 the eutectic mixture and its ingredients is mixed and while being mixed is heated to about 350° C. which is at or slightly above the thermal decomposition temperature of Ag$_2$O of about 350° C. The Ag$_2$O thermally decomposes according to the formula.

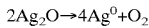

$$2Ag_2O \rightarrow 4Ag^0 + O_2$$

The silver resulting from the reaction plates out onto surfaces of the superconductor particles.

In step 322 the reaction is monitored by monitoring O$_2$ production. Steps 324, 326, 328, and 330 are then carried out which are the same as steps 124, 126, 128, and 130 in FIG. 1, respectively.

It should be noted that following step 330, wherein the eutectic mixture is heated to 200° C. to cause melting thereof, step 316 is directly carried out. Because of the relatively high thermal decomposition temperature of Ag$_2$O, there is no need to first cool the eutectic mixture before step 316 is carried out, as is required in step 114 in FIG. 1.

FIG. 1 in step 112 also shows that the mixture of salts is heated to 255° C. to form a eutectic mixture, whereafter it is cooled in step 114. The AgNO$_3$ is subsequently added in step 118. The AgNO$_3$ cannot be added to the salts and be heated in step 112 because AgNO$_3$ has a thermal decomposition temperature in the eutectic mixture of 200° C. which is lower than the temperature to which the eutectic mixture is heated in step 112, and heating of the AgNO$_3$ to 255° C. in step 112 would cause thermal decomposition of the AgNO$_3$. Ag$_2$O, by contrast, has a thermal decomposition temperature which is much higher than the eutectic mixture heated in step 112. Ag$_2$O can thus be mixed with the eutectic mixture in step 112 without causing thermal decomposition of the Ag$_2$O.

Figure 4:
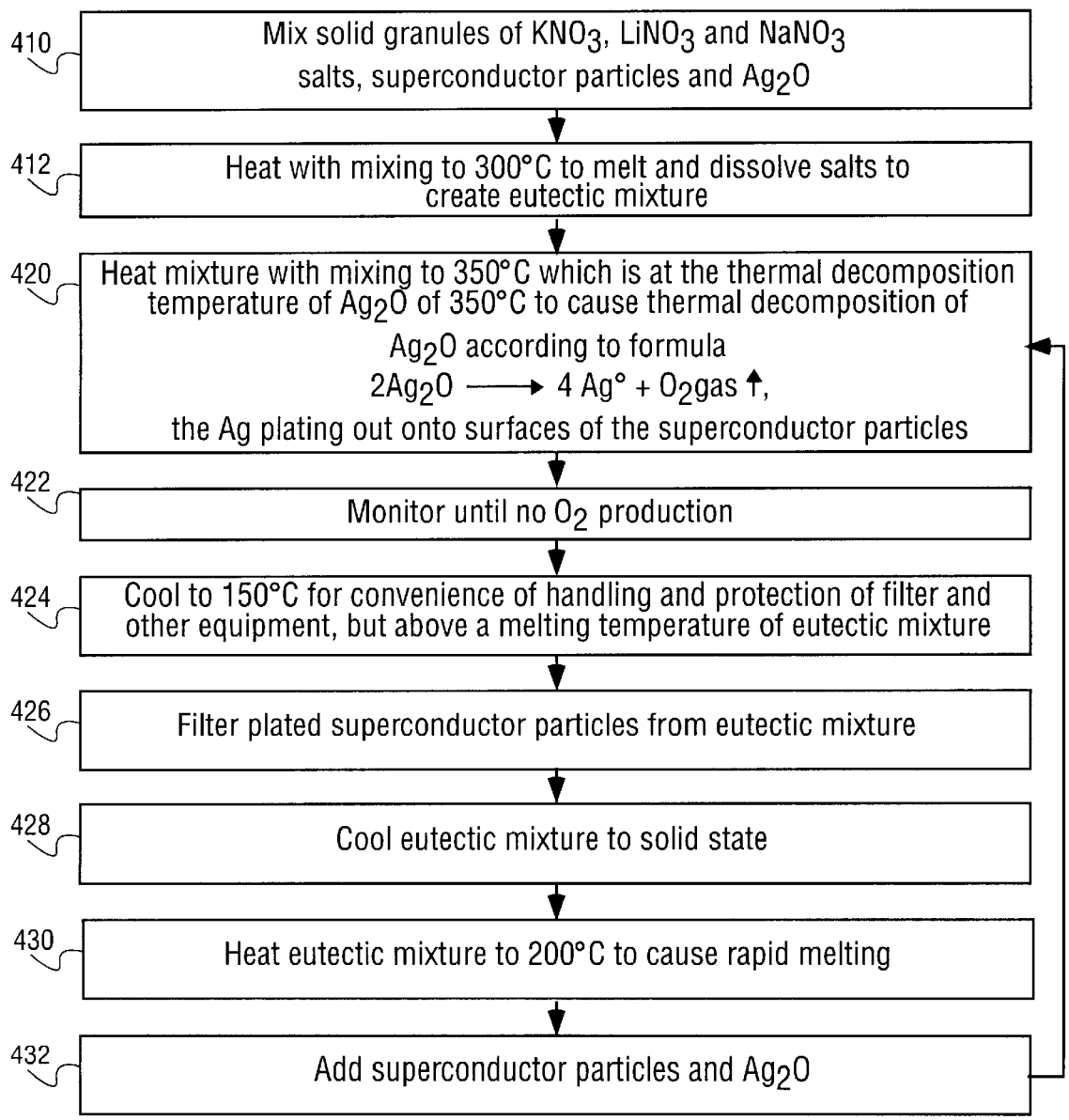
FIG. 4 is a flow chart illustrating yet a further method of plating onto superconductor particles wherein $Ag_2O$ is premixed with individual salts of a eutectic mixture and subsequently melted to create a eutectic mixture with the $Ag_2O$ in suspension in the eutectic mixture.

FIG. 4 illustrates a method wherein Ag$_2$O is premixed with individual salts of a eutectic mixture. In step 410 solid granules of KNO$_3$, LINO$_3$ and NaNO$_3$ salts are mixed with superconductor particles and solid granules of Ag$_2$O.

In step 412 the mixture of the salts, superconductor particles and Ag$_2$O granules is heated with mixing to 300° C. The individual salts melt and dissolve to create a eutectic mixture. The temperature of 300° C. is however still below a thermal decomposition temperature of 350° C. of Ag$_2$O. Plating of silver does not occur.

Step 420 is then carried out which is the same as step 320 in FIG. 3, thus causing plating of silver on the superconductor particles. Following step 420, steps 422, 424, 426, 428, and 430 are carried out which are the same as steps 322, 324, 326, 328, and 330 in FIG. 3. In step 432 more superconductor particles and Ag$_2$O are added to the eutectic mixture, whereafter step 420 can again be carried out and the process be repeated.

Figure 5:
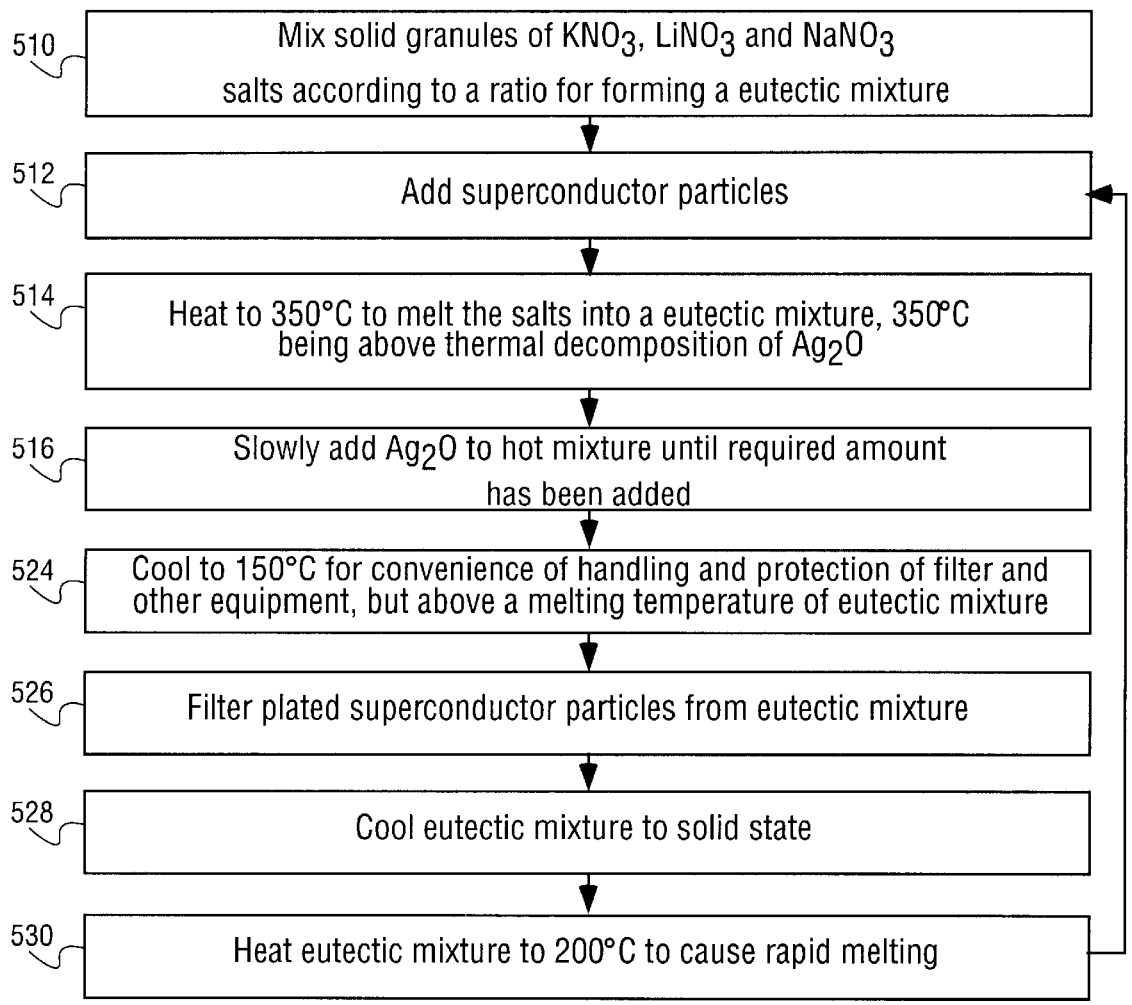
FIG. 5 is a flow chart of yet a further method of plating onto superconductor particles wherein $Ag_2O$ is slowly added to a hot eutectic mixture, for purposes of controlling plating and forming thicker plating layers.

The Ag$_2$O added in step 318 in FIG. 3 does not go into solution in the eutectic mixture. Such is also the case with the Ag$_2$O mixed with the granules and the superconductor particles in step 410 and heated in step 412 in FIG. 4. It has been found that it is fairly difficult to control uniformity of Ag$_2$O in suspension in the eutectic mixture. For uniformity in thickness of plating layers between superconductor particles it is necessary to add only a small amount of Ag$_2$O to the eutectic mixture. Only thin layers of silver can be plated on the superconductor particles because of the limited amount of Ag$_2$O that can be used utilizing the processes of FIG. 3 or FIG. 4. FIG. 5 now illustrates an alternative process wherein small amounts of Ag$_2$O are continuously fed into the eutectic mixture at a high temperature. Such a process allows for control of Ag$_2$O in suspension in the eutectic mixture and the formation of thicker plating layers.

In step 510 a mixture of salts is formed as in step 110 in FIG. 1. In step 512 superconductor particles are mixed with the solid granules of the salts.

In step 510 the mixture of the salts and the superconductor particles is heated to about 350° C. to melt the salts into a eutectic mixture. The temperature of 350° C. is also at or slightly above the thermal decomposition temperature of Ag$_2$O.

In step 516 Ag$_2$O granules are slowly added to the hot mixture. The addition of the Ag$_2$O at the temperature of 350° C. results in thermal decomposition of the Ag$_2$O and consequent silver plating onto surfaces of the superconductor particles. The Ag$_2$O particles may, for example, be added utilizing a screw which transfers the Ag$_2$O particles through an argon jacket into the eutectic mixture. An apparatus with such a screw is known in the art. Step 516 is continued until a required amount of Ag$_2$O is added to the eutectic mixture for purposes of forming silver layers of required thickness.

Steps 524, 526, 528, and 530 are then carried out which are the same as steps 124, 126, 128, and 130 in FIG. 1, respectively. Following step 530, step 512 can again be carried out and the process be repeated.

Thus, thermal decomposition of Ag$_2$O is described with reference to the examples in FIG. 3, FIG. 4, and FIG. 5. An analogous material to Ag$_2$O is another silver oxide namely AgO. It is presently believed that AgO is also insoluble in the eutectic mixture and that its thermal decomposition temperature is similar to that of the thermal decomposition temperature of Ag$_2$O.

Although the examples described with reference to FIG. 3, FIG. 4, and FIG. 5 relate to thermal decomposition of Ag$_2$O (or AgO), it should be noted that these processes can be modified to allow for photodecomposition or decomposition by sonification instead of thermal decomposition. It should also be noted that the examples described with reference to FIG. 1 to FIG. 5 relate to specific processes of thermal decomposition, photodecomposition, and decomposition by sonification, but that it is within the scope and spirit of the invention that other forms of decomposition may occur to one skilled in the art. One such an alternative form of decomposition is, for example, by adding a reducing agent. For example, a reducing agent may be added to the eutectic mixture of FIG. 1 to cause decomposition of AgNO$_3$ into a silver compound and another compound, the silver compound plating out onto surfaces of the superconductor particles.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method of forming a superconductor composite, comprising:

heating a salt to a melting temperature of the salt;

adding superconductor particles to the salt;

adding a metal composition to the salt, the metal composition being of a different material than the salt;

decomposing the metal composition into a metal substance and another substance, the metal substance plating out on surfaces of the superconductor particles to form metal plated superconductor particles; and removing the metal plated superconductor particles from the salt.

2. The method of claim 1 wherein the salt is a mixture of at least two individual salts, the mixture having a melting temperature below a melting temperature of each of the individual salts.

3. The method of claim 2 wherein at least one of the individual salts has a melting temperature above a thermal decomposition temperature of the metal composition.

4. The method of claim 3 wherein the individual salts of the mixture are $KNO_3$, $LiNO_3$, and $NaNO_3$.

5. The method of claim 1 wherein the metal composition is a silver composition which thermally decomposes into a silver substance and another substance, the silver substance plating out on the surfaces of the superconductor particles.

6. The method of claim 5 wherein the silver composition is selected from the group consisting of $Ag_2O$, $AgO$, $AgNO_3$, and $AgNO_2$.

7. The method of claim 5 wherein the silver composition is soluble in the salt.

8. The method of claim 7 wherein the silver composition is $AgNO_3$.

9. The method of claim 1 wherein, after removal of the metal plated superconductor particles from the salt, again:
    adding superconductor particles to the salt;
    adding a metal composition to the salt;
    decomposing the metal composition into a metal substance and another substance, the metal substance plating out on surfaces of the superconductor particles to form metal plated superconductor particles; and
    removing the metal plated superconductor particles from the salt.

10. The method of claim 1 wherein the metal composition is decomposed according to a process selected from the group consisting of thermal decomposition, photodecomposition, and sonification.

11. The method of claim 1 wherein the salt is at a temperature below a thermal decomposition temperature of the metal composition when the metal composition is added to the salt, and the metal composition is decomposed by heating the salt to above the thermal decomposition temperature of the metal composition.

12. The method of claim 1 further comprising:
    locating the metal plated superconductor particles within a matrix material, the matrix material being selected to be driven to a superconductive state by the superconductor particles, and the metal substance being selected and being of a thickness which allows the matrix material to be driven to a superconductive state by the superconductor particles through the metal substance.

13. The method of claim 12 wherein the superconductor particles are in a superconductive state at a temperature of liquid nitrogen.

14. The method of claim 1 wherein the salt includes no silver.

15. The method of claim 1 wherein the salt is not $AgNO_3$.

16. The method of claim 15 wherein the metal composition is selected from the group consisting of $Ag_2O$, $AgO$, $AgNO_3$, and $AgNO_2$.

17. The method of claim 15 wherein the metal composition is $AgNO_3$.

18. A method of forming a superconductor composite, comprising:
    heating a eutectic of at least two individual salts to a first temperature which is above a melting temperature of the eutectic but below a melting temperature of at least one of the individual salts;
    adding superconductor particles to the eutectic;
    adding a silver composition to the eutectic while the eutectic is at the first temperature, the first temperature being below a thermal decomposition temperature of the silver composition in the eutectic, at least one of the individual salts having a melting temperature above the thermal decomposition temperature;
    heating the eutectic to a second temperature which is above the thermal decomposition temperature to cause thermal decomposition of the silver composition into a silver substance and another substance, the silver substance plating out on surfaces of the superconductor particles;
    removing the superconductor particles from the eutectic; and
    locating the silver plated superconductor particles within a matrix material, the matrix material being selected to be driven to a superconductive state by the superconductor particles, and the silver substance being selected and being of a thickness which allows the matrix material to be driven to a superconductive state by the superconductor particles through the silver substance.

19. A method of forming a superconductor composite, comprising:
    heating a salt to a melting temperature of the salt;
    adding superconductor particles to the salt, the salt being a mixture of at least two individual salts, the mixture having a melting temperature below a melting temperature of each of the individual salts;
    adding a metal composition to the salt;
    decomposing the metal composition into a metal substance and another substance, the metal substance plating out on surfaces of the superconductor particles to form metal plated superconductor particles; and
    removing the metal plated superconductor particles from the salt.

20. The method of claim 19 wherein at least one of the individual salts has a melting temperature above a thermal decomposition temperature of the metal composition.

* * * * *